(12) United States Patent
Deguchi et al.

(10) Patent No.: US 8,598,954 B2
(45) Date of Patent: Dec. 3, 2013

(54) DOHERTY AMPLIFIER AND SEMICONDUCTOR DEVICE

(71) Applicant: Sumitomo Electric Device Innovations, Inc., Yokohama (JP)

(72) Inventors: Hiroaki Deguchi, Yokohama (JP); Kaname Ebihara, Yokohama (JP)

(73) Assignee: Sumitomo Electric Device Innovations, Inc., Yokohama-shi, Kanagawa (JP)

(*) Notice: Subject to any disclaimer, the term of this patent is extended or adjusted under 35 U.S.C. 154(b) by 0 days.

(21) Appl. No.: 13/778,462

(22) Filed: Feb. 27, 2013

(65) Prior Publication Data
US 2013/0169366 A1 Jul. 4, 2013

Related U.S. Application Data

(63) Continuation of application No. 13/186,064, filed on Jul. 19, 2011, now Pat. No. 8,395,450.

(30) Foreign Application Priority Data

Jul. 20, 2010 (JP) ................................. 2010-163408

(51) Int. Cl.
*H03F 3/68* (2006.01)
(52) U.S. Cl.
USPC ...................................... 330/295; 330/124 R

(58) Field of Classification Search
USPC ................................. 330/295, 124 R, 84, 126
See application file for complete search history.

(56) References Cited

U.S. PATENT DOCUMENTS

| | | | |
|---|---|---|---|
| 4,338,572 A | 7/1982 | Schurmann | |
| 6,433,693 B1 | 8/2002 | Mathews, Jr. | |
| 6,472,934 B1 | 10/2002 | Pehlke | |
| 7,145,394 B2 | 12/2006 | Numanami et al. | |
| 7,961,048 B2* | 6/2011 | Oakley et al. | 330/295 |
| 2012/0019326 A1* | 1/2012 | Deguchi et al. | 330/295 |
| 2012/0025915 A1* | 2/2012 | Ui | 330/295 |
| 2012/0146732 A1* | 6/2012 | Murao | 330/295 |

FOREIGN PATENT DOCUMENTS

JP 2005-322993 A 11/2005

* cited by examiner

*Primary Examiner* — Henry Choe
(74) *Attorney, Agent, or Firm* — Westerman, Hattori, Daniels & Adrian, LLP

(57) ABSTRACT

A Doherty amplifier includes a carrier amplifier including a first FET, the first FET having a plurality of gate electrodes, and a peaking amplifier including a second FET, the second FET having a plurality of gate electrodes, a gate-to-gate interval of the gate electrodes of the second FET being shorter than a gate-to-gate interval of the first FET.

8 Claims, 11 Drawing Sheets

DOHERTY AMPLIFIER AND SEMICONDUCTOR DEVICE

CROSS-REFERENCE TO RELATED APPLICATION

This application is a continuation application of U.S. patent application Ser. No. 13/186,064 filed Jul. 19, 2011, and is based upon and claims the benefits of priority from Japanese Patent Application No. 2010-163408 filed on Jul. 20, 2010, the entire contents of which are incorporated herein by reference.

BACKGROUND (i) Technical Field

A certain aspect of the embodiments discussed herein is related to a Doherty amplifier and a semiconductor device. Another aspect of the embodiments is related to a Doherty amplifier and a semiconductor device including FETs.

(ii) Related Art

A Doherty amplifier is used as radio communications amplifier (see Japanese Patent Application Publication No. 2005-322993). The Doherty amplifier includes a carrier amplifier and a peaking amplifier. The carrier amplifier is an amplifier that primarily amplifies an input signal. The peaking amplifier is an amplifier that amplifies the peak of the input signal. For example, the carrier amplifier always amplifies the input signal. In contrast, the peaking amplifier amplifies the input signal only when the input signal has power equal to or higher than a predetermined level.

The Doherty amplifier has a difficulty in downsizing because of the use of both the carrier amplifier and the peaking amplifier.

SUMMARY

According to an aspect of the present invention, there is provided a Doherty amplifier including: a carrier amplifier including a first FET, the first FET having a plurality of gate electrodes; and a peaking amplifier including a second FET, the second FET having a plurality of gate electrodes, a gate-to-gate interval of the gate electrodes of the second FET being shorter than a gate-to-gate interval of the first FET.

DETAILED DESCRIPTION

Embodiments of the present invention are described below with reference to the accompanying drawings.

(First Embodiment)

Figure 1:
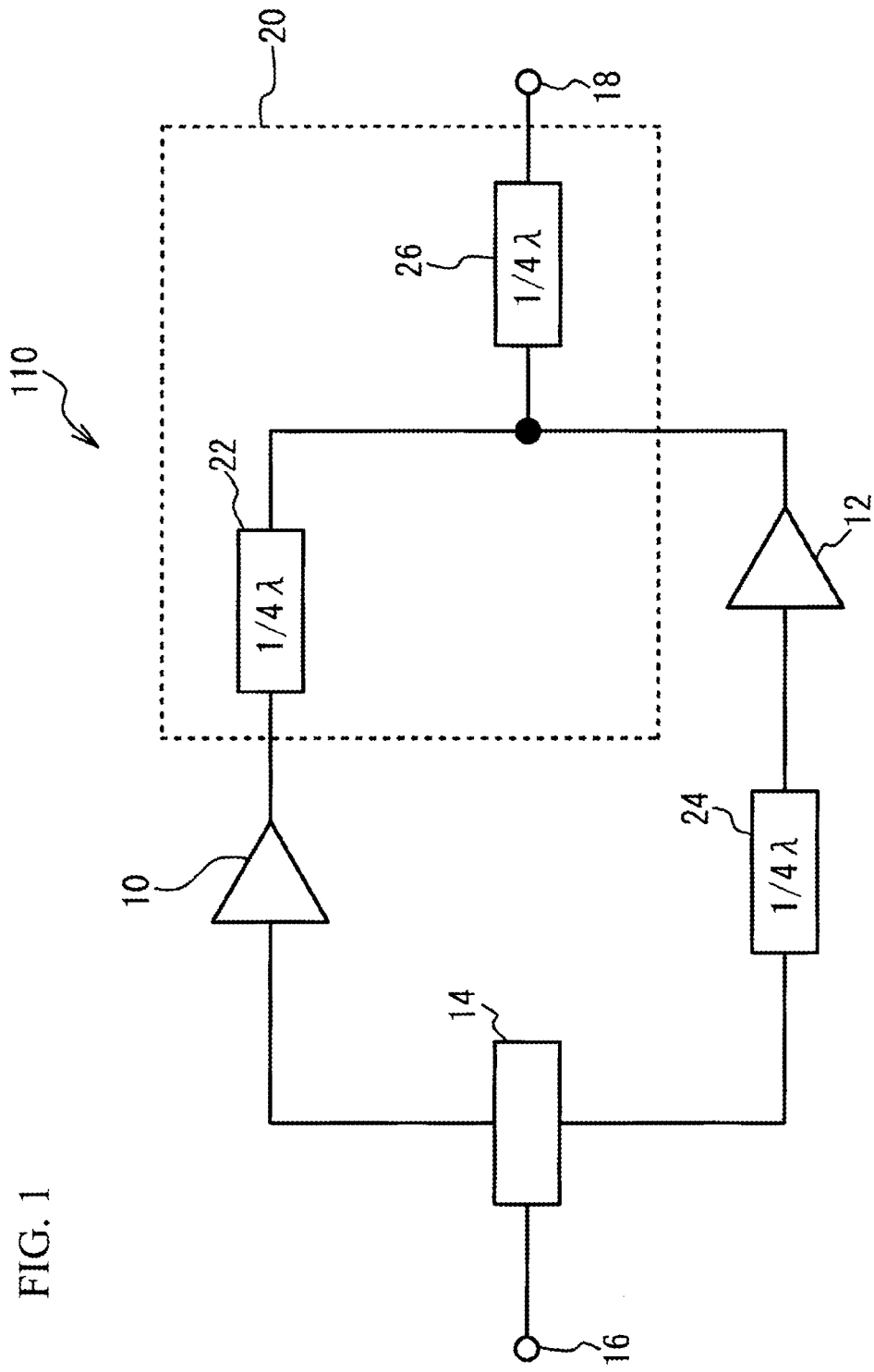
FIG. 1 is a circuit diagram of a Doherty amplifier in accordance with a first embodiment.

FIG. 1 is a circuit diagram of a Doherty amplifier in accordance with a first embodiment. A Doherty amplifier 110 includes a carrier amplifier 10, a peaking amplifier 12, a splitter 14 and a combiner 20. The splitter 14 splits an input signal applied to an input terminal 16 to two paths. For example, the splitter 14 equally splits the input signal to two signals. The carrier amplifier 10 receives one of the two input signals and amplifies the input signal. The peaking amplifier 12 receives the other input signal and amplifies it. The combiner 20 has a node at which the output signal of the carrier amplifier 10 and that of the peaking amplifier 12 are combined, and $\lambda/4$ phase lines 22 and 26 where $\lambda$ is the wavelength of the combined signal. The $\lambda/4$ phase line 22 is connected to the rear stage of the carrier amplifier 10. The $\lambda/4$ phase line 26 follows the node at which the outputs of the carrier amplifier 10 and the peaking amplifier 12 are combined. The combiner 20 adjusts the impedances of the outputs of the carrier amplifier 10 and the peaking amplifier 12, and combines the output signals thereof. The signal output by the combiner 20 is output via an output terminal 18. A $\lambda/4$ phase line 24 is connected to the front stage of the peaking amplifier 12.

The $\lambda/4$ phase lines 22 and 26 perform an impedance transformation so that the load connected to the output of the carrier amplifier 10 is twice the load connected to the output terminal 18 when power is as low as only the carrier amplifier 10 operates. In contrast, when power is as high as both the carrier amplifier 10 and the peaking amplifier 12 operate, the $\lambda/4$ phase lines 22 and 26 perform an impedance transformation so that the load connected to the outputs of the carrier amplifier 10 and the peaking amplifier 12 is equal to that connected to the output terminal 18. The $\lambda/4$ phase line 24 is a line intended to compensate for a phase difference between the carrier amplifier 10 and the peaking amplifier 12 due to the $\lambda/4$ phase line 22 associated with the carrier amplifier 10.

The carrier amplifier 10 is, for example, a class-A or class-AB amplifier, and always amplifies the split signal from the splitter 14. The peaking amplifier 12 is, for example, a class-C amplifier, and amplifies the split signal that has a power higher than a predetermined power.

Figure 2:
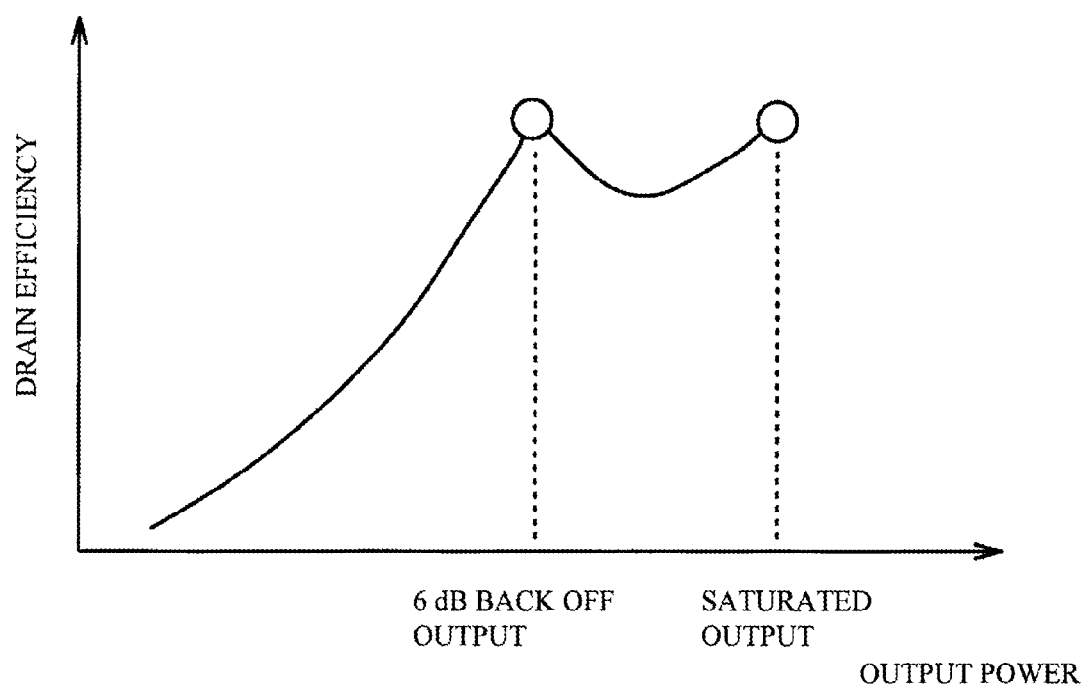
FIG. 2 is a graph of the drain efficiency associated with the output power of the Doherty amplifier.

FIG. 2 is a graph that illustrates the drain efficiency associated with the output power of the Doherty amplifier. Referring to FIG. 2, when the output power is saturated, the carrier amplifier 10 and the peaking amplifier 12 have respective saturated powers. Thus, the drain efficiency is maximized. At an output that is 6 dB lower than the saturated power (6 dB back-off output), only the carrier amplifier 10 has the saturated power, and the peaking amplifier 12 does not amplify the signal. This case also has the maximum drain efficiency. Since the drain efficiency is maximized at two output powers, it is possible to obtain a wide range of output power having high drain efficiencies. For example, in many cases, power amplifiers for digital modulation signals are operated at an output power that is 5 dB~8 dB lower than the saturated power in order to maintain the linearity. The Doherty amplifier is capable of improving the drain efficiency at back-off powers, as illustrated in FIG. 2.

In a case where the carrier amplifier 10 and the peaking amplifier 12 have an identical size, the load connected when only the carrier amplifier 10 operates is twice the load connected when both the carrier amplifier 10 and the peaking amplifier 12 operate. Thus, when only the carrier amplifier 10 operates, the amplifier size and current are halves those obtained when both the carrier amplifier 10 and the peaking amplifier 12 operate, and the output power is ¼. Thus, as illustrated in FIG. 2, the output power obtained when only the carrier amplifier 10 operates is 6 dB (¼) lower than that obtained when both the carrier amplifier 10 and the peaking amplifier 12 operate. By changing the sizes of the carrier amplifier 10 and the peaking amplifier 12 from the ratio of 1:1, it is possible to change the peak of the drain efficiency from the 6 dB back-off output.

Figure 3:
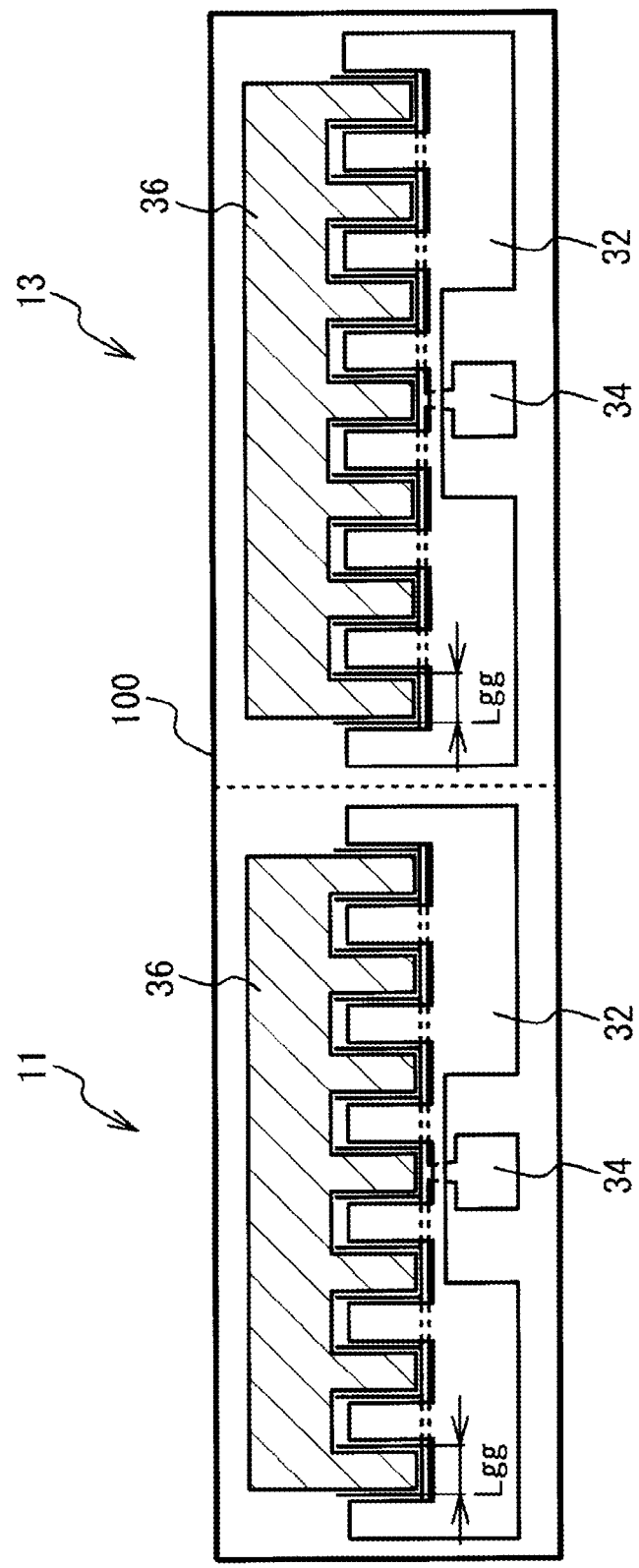
FIG. 3 is a plan view of a semiconductor device in accordance with a comparative example.

FIG. 3 is a plan view of a semiconductor device in accordance with a comparative example. The carrier amplifier 10 is formed by a first FET (Field Effect Transistor) 11, and the peaking amplifier 12 is formed by a second FET 13. The carrier amplifier 10 may include a matching circuit besides the first FET 11. The peaking amplifier 12 may include a matching circuit besides the second FET 13. In the comparative example, the first FET 11 and the second FET 13 have an identical gate width and an identical gate-to-gate interval. The first FET 11 and the second FET 13 have source electrodes 32, gate electrodes 34 and drain electrodes 36. The source electrodes 32 and the drain electrodes 36 are comb-tooth electrodes. A finger of the gate electrode 34 is interposed between the adjacent fingers of the source electrode 32 and the drain electrode 36.

The power consumed in the peaking amplifier 12 is less than that consumed in the carrier amplifier 10. In the Doherty amplifier used for base stations of radio communications, the power consumed in the peaking amplifier 12 is approximately ⅓ of that in the carrier amplifier 10. In the FETs, the gate-to-gate interval Lgg is adjusted so that the temperatures of the channels in operation are lower than a predetermined temperature. In the comparative example, the first FET 11 and the second FET 13 have the same gate-to-gate interval Lgg. Thus, when the gate-to-gate interval Lgg is designed so that the channel temperature in operation is equal to or lower than the predetermined temperature, the channel temperature of the second FET 13 in operation is lower than that of the first FET 11. Thus, the characteristics of the FETs may be varied complicatedly by temperature variation. In addition, the chip size becomes larger. For example, the long side of an area in which the first FET 11 is formed is 4 mm, and the short side of an area in which the second FET 13 is formed is 0.8 mm.

Figure 4:
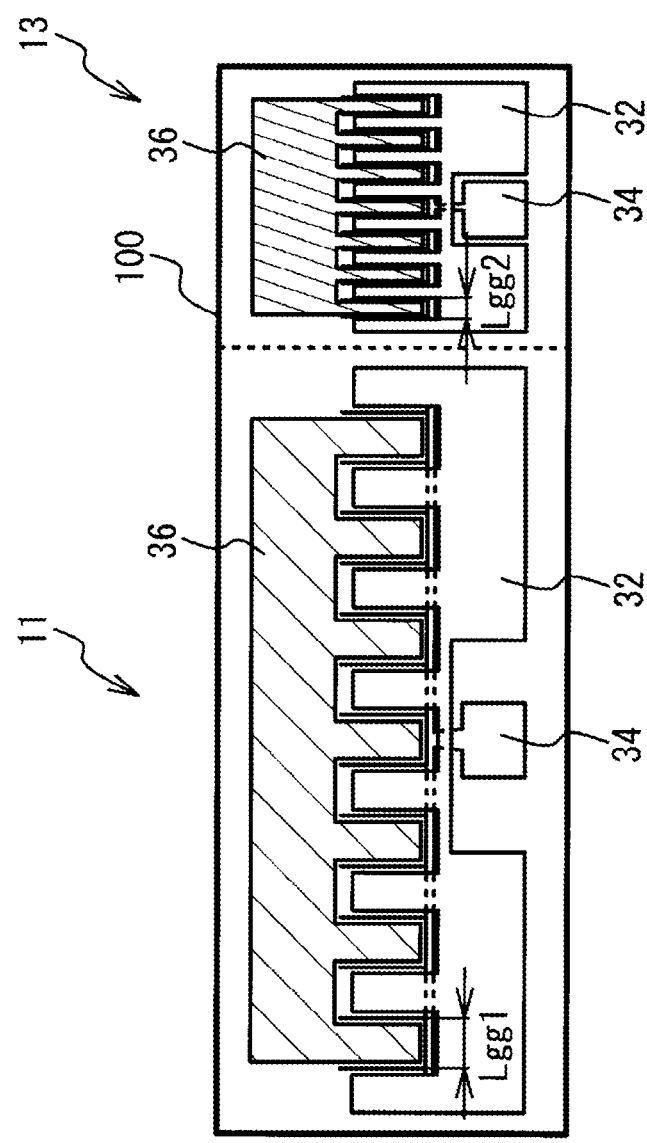
FIG. 4 is a plan view of a semiconductor device used for the Doherty amplifier of the first embodiment.

According to an aspect of a first embodiment, there is provided a semiconductor device taking the above into consideration. FIG. 4 is a plan view of a semiconductor device used for the Doherty amplifier in accordance with the first embodiment. Referring to FIG. 4, the first FET 11 and the second FET 13 are formed on a chip 100 (substrate). The gate-to-gate interval Lgg2 of the second FET 13 is shorter than the gate-to-gate interval Lgg1 of the first FET 11. For example, the gate-to-gate interval Lgg1 of the first FET 11 is 400 μm, and the finger widths (measured in a direction perpendicular to a direction in which the fingers extend) of the source electrode 32 and the drain electrode 36 are 350 μm. The gate-to-gate interval Lgg2 of the second FET 13 is 100 μm, and the finger widths of the source electrode 32 and the drain electrode 36 are 50 μm. The long side of an area in which the first FET 11 is formed is 4 mm, and the short side thereof is 0.8 mm. The long side of an area in which the second FET 13 is formed is 1.2 mm, and the short side thereof is 0.8 mm. The gate-to-gate interval Lgg1 and Lgg2 may be modulated to achieve a thermally balance in the FETs. When the gate-to-gate interval is modulated, the gate-to-gate interval may assume the average distance of the gate electrodes (gate fingers) in each of FETs 11 and 13.

Figure 5A:
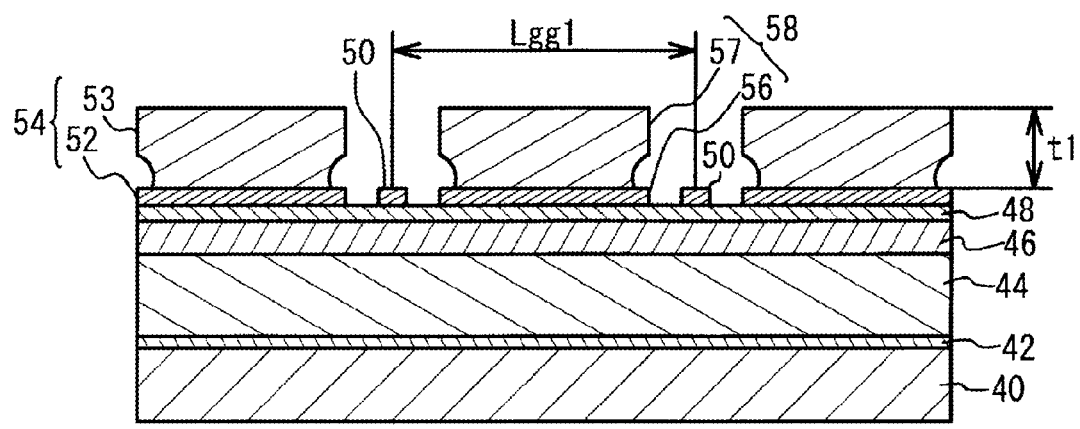
FIGS. 5A and 5B are respectively cross-sectional views of first and second FETs.
Figure 5B:
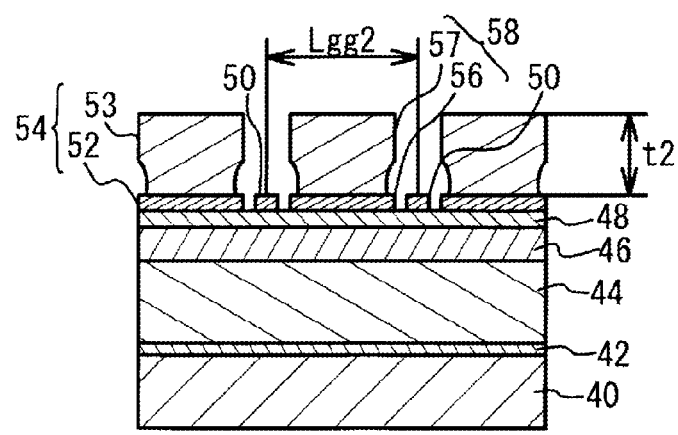

FIGS. 5A and 5B are respectively cross-sectional views of the first FET and the second FET. Referring to FIGS. 5A and 5B, a buffer layer 42 is formed on a substrate 40 made of, for example, SiC or sapphire. The buffer layer 42 may be an AlN layer having a thickness of, for example, 300 nm. A channel layer 44 is formed on the buffer layer 42. The channel layer 44 may be a GaN layer having a thickness of 1 μm. An electron supply layer 46 is formed on the channel layer 44. The electron supply layer 46 may be an n-AlGaN layer, which has, for example an aluminum composition of 0.2 and a thickness of 20 nm. A cap layer 48, which may be an n-GaN layer, is formed on the electron supply layer 46.

A source metal layer 52 and a drain metal layer 56, which may be Ti/Al or Ta/Al, are formed on the cap layer 48. A source interconnection 53, which may be made of Au and has a thickness of, for example, 3 μm, is formed on the source metal layer 52. A drain interconnection 57, which may be made of Au and has a thickness of, for example, 3 μm, is formed on the drain metal layer 56. A source electrode 54 is composed of the source metal layer 52 and the source interconnection 53. A drain electrode 58 is composed of the drain metal layer 56 and the drain interconnection 57. The gate electrode 50, which may be Ni/Au, is formed between the source electrode 54 and the drain electrode 58. The thicknesses $t_1$ of the source electrode 54 and the drain electrode 58 of the first FET 11 are equal to the thicknesses $t_2$ of the source electrode 54 and the drain electrode 58 of the second FET 13.

The gate-to-gate interval Lgg2 of the second FET 13 is shorter than the gate-to-gate interval Lgg1 of the first FET 11. In the first FET 11 having large power consumption, the gate-to-gate interval Lgg1 is relatively large so that the channel temperature in operation is equal to or lower than the predetermined temperature. In the second FET 13 having small power consumption, the gate-to-gate interval Lgg2 is relatively small so that the chip size can be reduced. It is further possible to suppress the temperature difference between the first FET 11 and the second FET 13 in operation. It is thus possible to suppress characteristic variation depending on the temperatures of the first FET 11 and the second FET 13. For example, the ratio of powers consumed in the carrier amplifier 10 and the peaking amplifier 12 may be set equal to the ratio of the gate-to-gate interval Lgg1 of the first FET 11 and the gate-to-gate interval Lgg2 of the second FET 13. For example, in a case where the first FET 11 and the second FET 13 have an identical gate width, Lgg2 may be set equal to ¼ of Lgg1.

It is preferable that the first FET 11 and the second FET 13 have almost the same characteristics. It is thus preferable that the first FET 11 and the second FET 13 have the same gate lengths, the same source-gate distances, the same gate-drain distances and the same gate widths. The first FET 11 and the second FET 13 have almost the same characteristics by forming the first FET 11 and the second FET 13 on the same chip.

Figure 6:
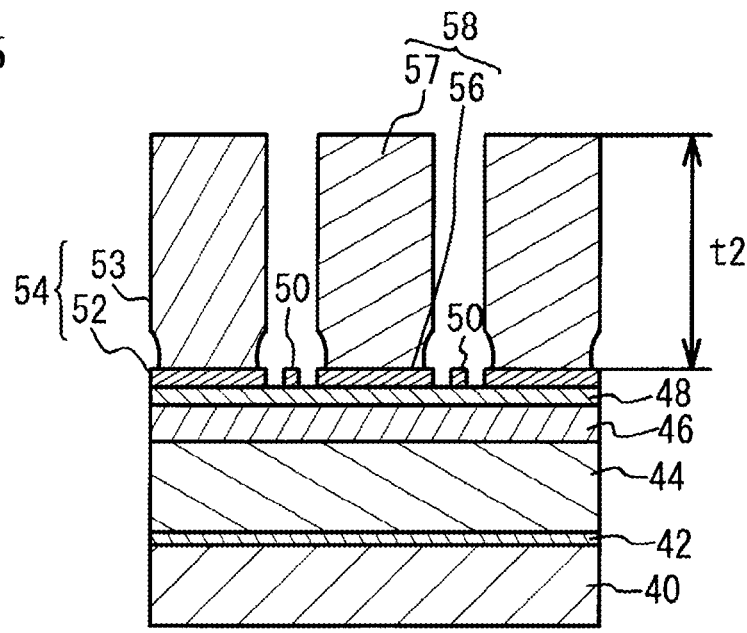
FIG. 6 is a cross-sectional view of another example of the second FET.

FIG. 6 is a cross-sectional view of another example of the second FET 13. The thicknesses $t_2$ of the source electrode 54 and the drain electrode 58 of the second FET 13 are greater than the thicknesses $t_1$ of the source electrode 54 and the drain electrode 58 of the first FET 11 illustrated in FIG. 5A. In the first embodiment, the widths of the source electrode 54 and the drain electrode 58 of the second FET 13 are smaller than those of the first FET 11. Thus, the current density of the source electrode 54 of the second FET 13 and that of the drain electrode 58 thereof may be greater than predetermined values. According to the structure illustrated in FIG. 6, the widths of the source electrode 54 and the drain electrode 58 of the second FET 13 can be reduced, and the current densities thereof can be reduced. It is thus possible to set the thickness $t_1$ of the first FET 11 to 3 μm and set the thickness $t_2$ of the second FET 13 to 10 μm.

The first FET 11 and the second FET 13 of the first embodiment are not limited to FETs using a nitride semiconductor but may be FETs using a GaAs-based semiconductor. The nitride semiconductor is, for example, GaN, InN, AlN, AlGaN, InGaN, InAlN and InAlGaN. The GaAs-based semiconductor is, for example, GaAs, InAs, AlAs, InGaAs, AlGaAs and InAlGaAs.

(Second Embodiment)

Figure 7:
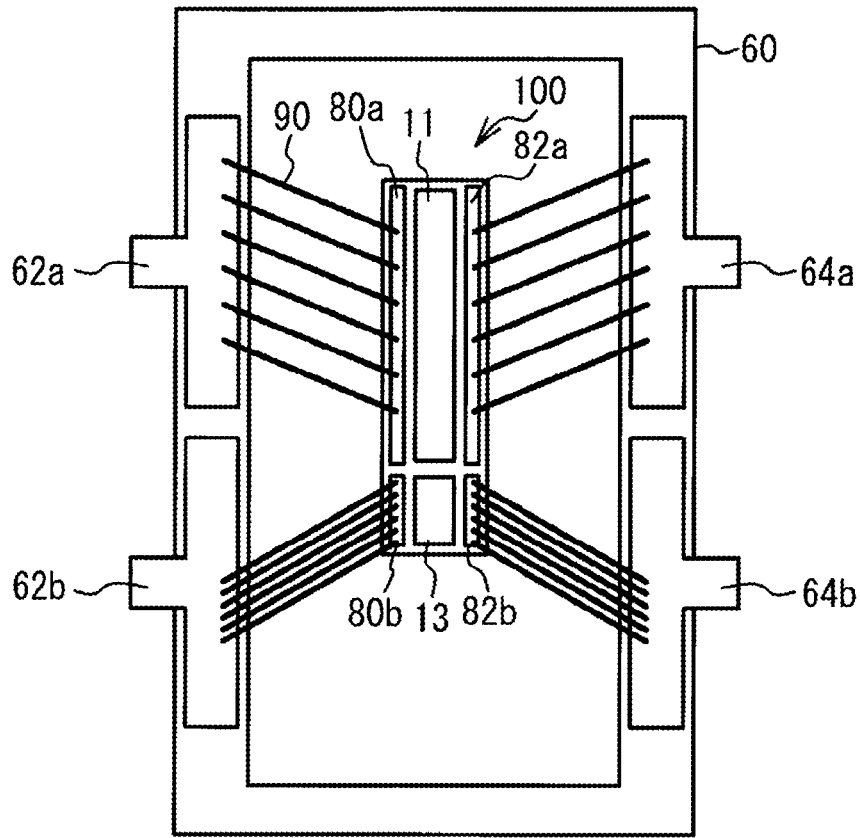
FIG. 7 is a plan view of a semiconductor device in accordance with a second embodiment.

A second embodiment is an exemplary semiconductor device in which the first FET 11 and the second FET 13 are formed on a single chip (substrate) and is mounted on a single package. FIG. 7 is a plan view of the semiconductor device of the second embodiment. The chip 100 on which the first FET 11 and the second FET 13 are formed is mounted on a package 60. The package 60 has input leads 62a and 62b, and output leads 64a and 64b. An input pad 80a of the first FET 11 and an input lead 62a are connected together by bonding wires 90. Similarly, an output pad 82a of the first FET 11 and an output pad 64a are connected together by bonding wires 90. An input pad 80b of the second FET 13 and an input lead 62b are connected together by bonding wires 90. Similarly, an output pad 82b of the second FET 13 and an output lead 64b are connected together by bonding wires 90.

Figure 8:
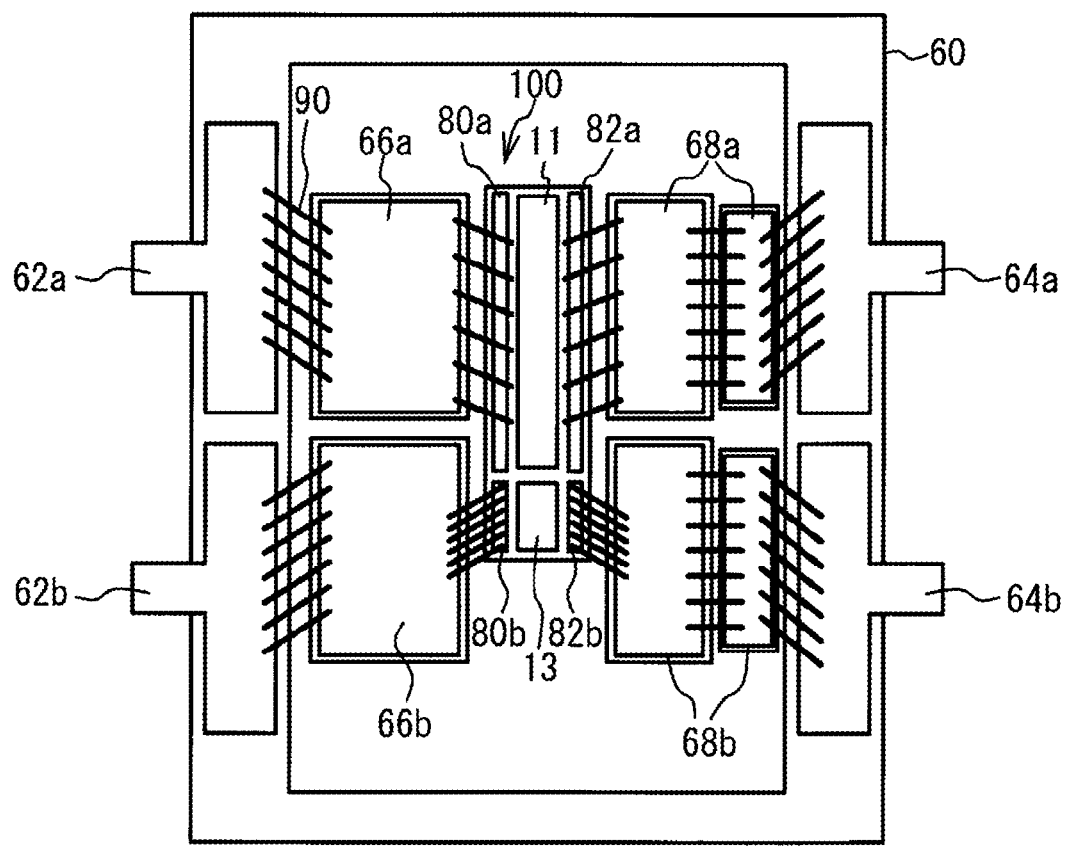
FIG. 8 is a plan view of another semiconductor device in accordance with the second embodiment.

FIG. 8 is a plan view of another exemplary semiconductor device in accordance with the second embodiment. On the package, there are mounted, besides the chips 100, chips on which input matching circuits 66a and 66b are respectively formed, and chips on which output matching circuits 68a and 68b are respectively formed. The input matching circuits 66a and 66b match the input with the input impedances of the first FET 11 and the second FET 13, respectively. The output matching circuits 68a and 68b match the output with the output impedances of the first FET 11 and the second FET 13, respectively. The input matching circuit 66a is provided between the input pad 80a and the input lead 62a, and are connected to the input pad 80a and the input lead 62a by bonding wires 90. The output matching circuit 68a is provided between the output pad 82a and the output lead 64a, and is connected to the output pad 82a and the output lead 64a by bonding wires 90. The input matching circuit 66b is provided between the input pad 80b and the input lead 62b, and is connected to the input pad 80b and the input lead 62b by bonding wires 90. The output matching circuit 68b is provided between the output pad 82b and the output lead 64b, and is connected to the output pad 82b and the output lead 64b by bonding wires 90.

According to the second embodiment, the first FET 11 and the second FET 13 are incorporated on the single chip 100, which is mounted on the package 60. Only a part of the input matching circuit and/or only a part of the output matching circuit may be mounted on the package 60. As illustrated in FIG. 7, the input matching circuits and the output matching circuits are not mounted on the package 60 at all.

(Third Embodiment)

Figure 9:
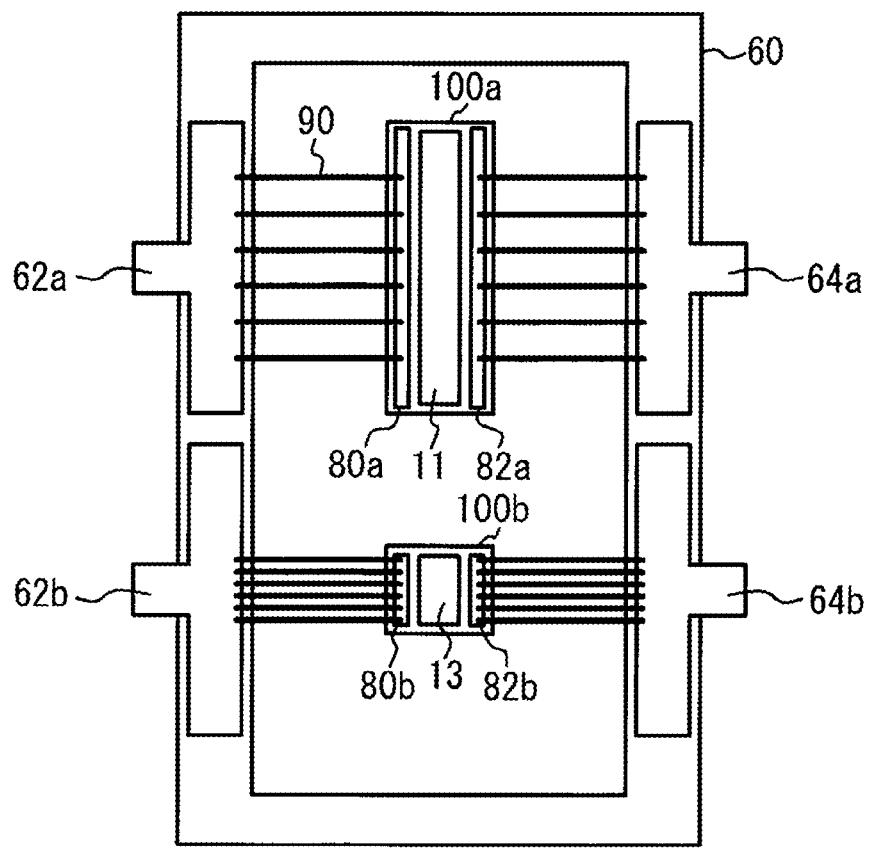
FIG. 9 is a plan view of a semiconductor device in accordance with a third embodiment.

A third embodiment is an exemplary semiconductor device in which the first FET 11 and the second FET 13 are formed on respective chips (substrates), which are mounted on a single package. FIG. 9 is a plan view of the semiconductor device of the third embodiment. Referring to FIG. 9, on the package 60, there are mounted a chip 100a on which the first FET 11 is formed, and a chip 100b on which the second FET 13 is formed. The other structures of the third embodiment are the same as those of the second embodiment illustrated in FIG. 7.

Figure 10:
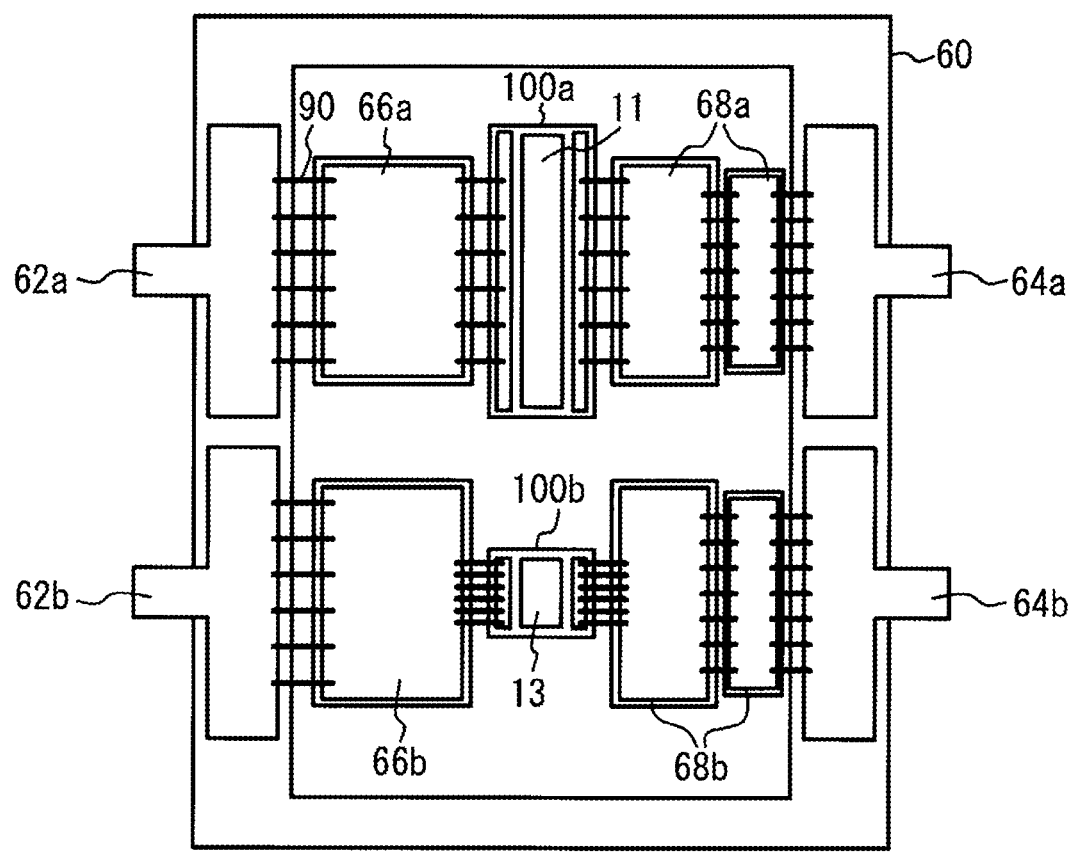
FIG. 10 is a plan view of another semiconductor device in accordance with the third embodiment.

FIG. 10 is a plan view of yet another example of the semiconductor device in accordance with the third embodiment. The chip 100a on which the first FET 11 is formed and the chip 100b on which the second FET 13 is formed are mounted on the package 60. The other structures of the present device are the same as those of the second embodiment illustrated in FIG. 8, and a description thereof is thus omitted.

According to the third embodiment, the first FET 11 and the second FET 13 are formed on the separate chips 100a and 100b, which are mounted on the single package 60. The third embodiment includes the input matching circuits 66a and 66b, and the output matching circuits 68a and 68b.

(Fourth Embodiment)

Figure 11A:
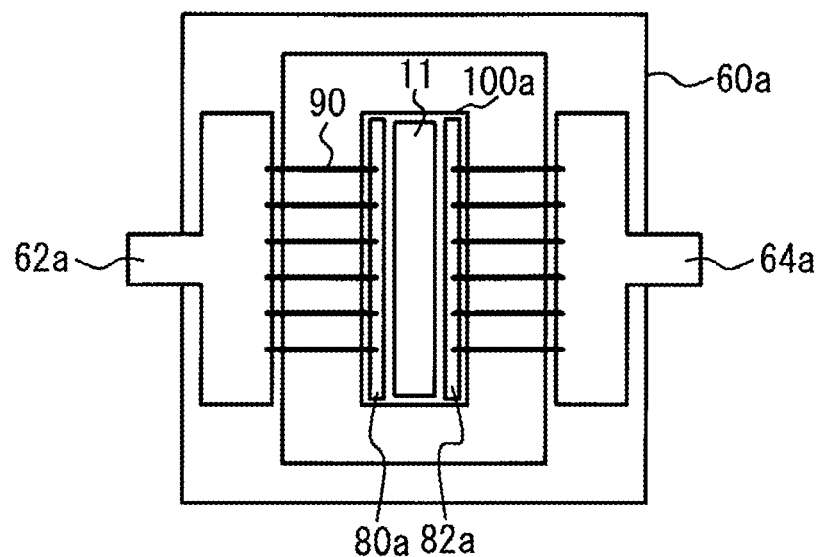
FIGS. 11A and 11B are respectively plan views of a semiconductor device in accordance with a fourth embodiment.
Figure 11B:
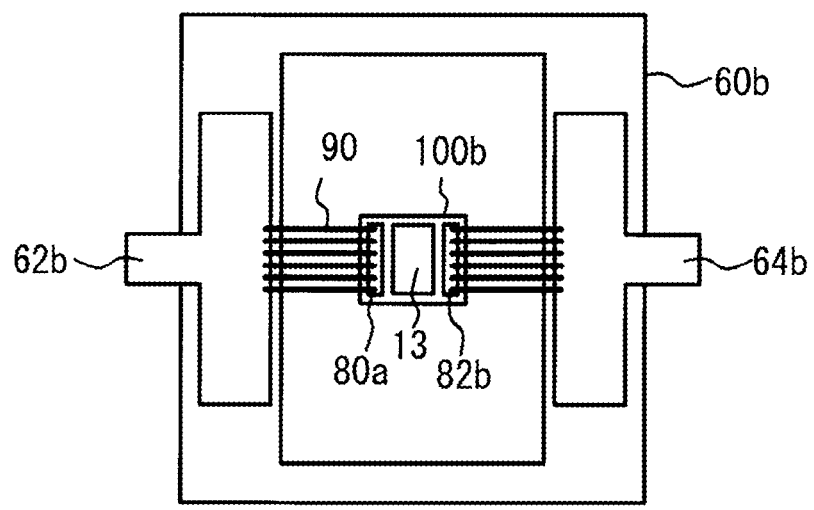

A fourth embodiment is an exemplary semiconductor device in which the first FET 11 and the second FET 13 are respectively formed on the separate chips, which are separately mounted on separate packages. FIGS. 11A and 11B are plan views of the semiconductor device in accordance with the fourth embodiment. As illustrated in FIG. 11A, the chip 100a on which the first FET 11 is formed is mounted on a package 60a. As illustrated in FIG. 11B, the chip 100b on which the second FET 13 is formed is mounted on a package 60b. The other structures of the fourth embodiment are the same as those of the third embodiment illustrated in FIG. 9, and a description thereof is omitted.

(Fourth Embodiment)

Figure 12A:
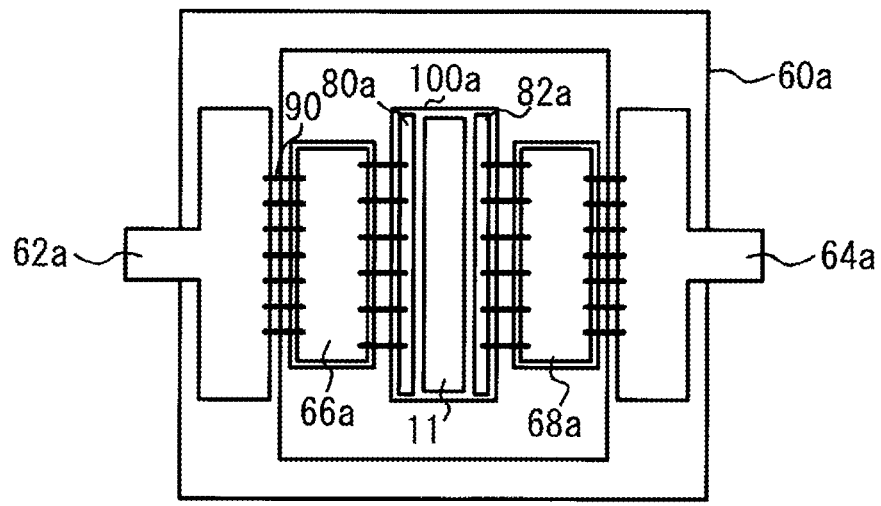
FIGS. 12A and 12B are respectively plan view of another semiconductor device in accordance with the fourth embodiment.
Figure 12B:
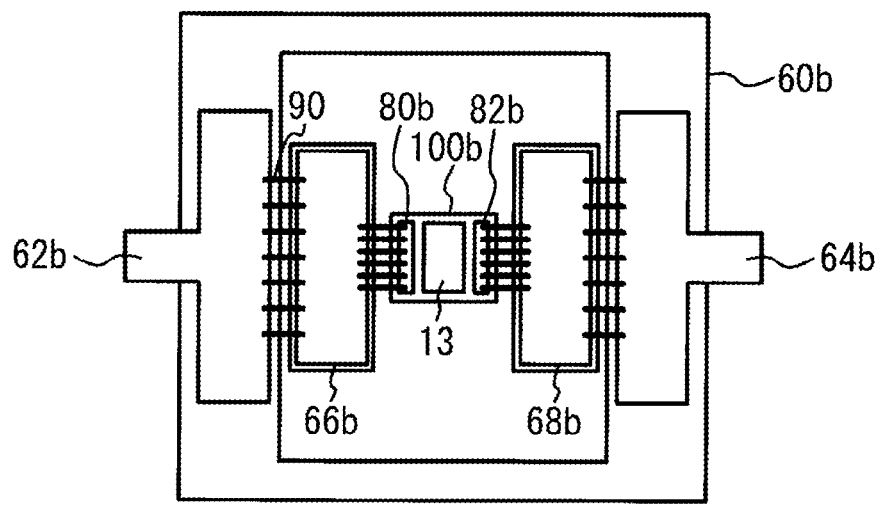

FIGS. 12A and 12B illustrate a fourth embodiment in which the first FET 11 and the second FET 13 are respectively formed on the separate chips 100a and 100b, which are respectively mounted on the separate packages 60a and 60b. The other structures of the fourth embodiment are the same as those of the third embodiment illustrated in FIG. 10, and a description thereof is omitted.

The fourth embodiment includes the input matching circuit 66a and the output matching circuit 68a respectively formed on the chips on the package 60a. Further, the fourth embodiment includes the input matching circuit 66b and the output matching circuit 68b respectively formed on the chips on the package 60b.

The present invention is not limited to the specifically described embodiments, but includes various embodiments and variations within the scope of the claimed invention.

What is claimed is:

1. A semiconductor device comprising:
   a first FET having a plurality of gate electrodes, a first input pad and a first output pad;
   a second FET having a plurality of gate electrodes, a second input pad and a second output pad, a gate-to-gate interval of the gate electrodes of the second FET being shorter than a gate-to-gate interval of the first FET; and
   a package having first and second input leads separated each other and first and second output leads separated each other, the first input pad and the first output pad connected to the first input lead and the first output lead by first bonding wires respectively, the second input pad and the second output pad connected to the second input lead and the second output lead by second bonding wires respectively.

2. The semiconductor device according to claim 1, wherein the first FET and the second FET are formed in independent chips.

3. The semiconductor device according to claim 1, wherein the first FET and the second FET are formed in a single chip.

4. The semiconductor device according to claim 3, wherein:
   the single chip has a rectangle shape; and
   the first and second bonding wires are inclined to a longer direction of the single chip.

5. The semiconductor device according to claim 1, wherein a source electrode and a drain electrode of the second FET are thicker than a source electrode and a drain electrode of the first FET.

6. The semiconductor device according to claim 1, wherein the gate-to-gate intervals of the first and second FETs are an average of distances of the gate electrodes.

7. The semiconductor device according to claim 1, wherein each of the first FET and the second FET is a GaN-based FET or a GaAs-based FET.

8. The semiconductor device according to claim 1, wherein the gate-to-gate interval of the second FET is equal to or shorter than ¼ of the gate-to-gate interval of the first FET.

* * * * *